(12) United States Patent
Lau et al.

(10) Patent No.: US 10,132,003 B2
(45) Date of Patent: Nov. 20, 2018

(54) HEATING MODULATORS TO IMPROVE EPI UNIFORMITY TUNING

(71) Applicant: Applied Materials, Inc., Santa Clara, CA (US)

(72) Inventors: Shu-Kwan Lau, Sunnyvale, CA (US); Surajit Kumar, Sunnyvale, CA (US); Joseph M. Ranish, San Jose, CA (US); Zhiyuan Ye, San Jose, CA (US); Kartik Shah, Saratoga, CA (US); Mehmet Tugrul Samir, Mountain View, CA (US); Errol Antonio C. Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/656,457

(22) Filed: Jul. 21, 2017

(65) Prior Publication Data

US 2018/0023214 A1 Jan. 25, 2018

Related U.S. Application Data

(60) Provisional application No. 62/365,742, filed on Jul. 22, 2016.

(51) Int. Cl.
| | |
|---|---|
| *C30B 25/16* | (2006.01) |
| *C30B 33/02* | (2006.01) |
| *C23C 16/44* | (2006.01) |
| *C30B 25/10* | (2006.01) |
| *C23C 16/46* | (2006.01) |

(52) U.S. Cl.
CPC .............. *C30B 33/02* (2013.01); *C23C 16/44* (2013.01); *C23C 16/46* (2013.01); *C30B 25/10* (2013.01)

(58) Field of Classification Search
CPC ......... C30B 25/00; C30B 25/10; C30B 25/16; C30B 35/00
See application file for complete search history.

(56) References Cited

U.S. PATENT DOCUMENTS

| | | | |
|---|---|---|---|
| 7,378,618 | B1 | 5/2008 | Sorabji et al. |
| 8,249,436 | B2 | 8/2012 | Aderhold et al. |
| 8,724,977 | B2 | 5/2014 | Aderhold et al. |
| 9,728,471 | B2 | 8/2017 | Aderhold et al. |
| 2009/0212037 | A1 | 8/2009 | Ranish et al. |
| 2010/0018960 | A1 | 1/2010 | Gat et al. |
| 2013/0180447 | A1 | 7/2013 | Ohnishi et al. |
| 2014/0246422 | A1 | 9/2014 | Koren et al. |
| 2016/0227606 | A1 | 8/2016 | Samir et al. |
| 2016/0234881 | A1 | 8/2016 | Rao et al. |

FOREIGN PATENT DOCUMENTS

WO       03014645 A2    2/2003

OTHER PUBLICATIONS

International Search Report and Written Opinion for PCT/US2017/042628 dated Nov. 8, 2017.

*Primary Examiner* — Robert M Kunemund
(74) *Attorney, Agent, or Firm* — Patterson + Sheridan LLP

(57) ABSTRACT

Embodiments disclosed herein generally related to a processing chamber, and more specifically a heat modulator assembly for use in a processing chamber. The heat modulator assembly includes a heat modulator housing and a plurality of heat modulators. The heat modulator housing includes a housing member defining a housing plane, a sidewall, and an annular extension. The sidewall extends perpendicular to the housing plane. The annular extension extends outward from the sidewall. The plurality of heat modulators is positioned in the housing member.

22 Claims, 10 Drawing Sheets

HEATING MODULATORS TO IMPROVE EPI UNIFORMITY TUNING

CROSS-REFERENCE TO RELATED APPLICATIONS

This application claims priority from U.S. application Ser. No. 62/365,742, filed Jul. 22, 2016, which is hereby incorporated in reference in its entirety.

BACKGROUND

Field

Embodiments described herein generally relate to a processing chamber, and more specifically, to a heat modulator assembly for use in a processing chamber.

Description of the Related Art

In the fabrication integrated circuits, deposition processes are used to deposit films of various materials upon semiconductor substrates. These deposition processes may take place in an enclosed process chamber. Epitaxy is a deposition process that grows a thin, ultra-pure layer, usually of silicon or germanium on a surface of a substrate. Forming an epitaxial layer on a substrate with uniform thickness across the surface of the substrate can be challenging. For example, there are often portions of the epitaxial layer, where thickness dips or rises for an unknown reason. These variations in thickness degrade the quality of the epitaxial layer and increase production costs.

Therefore, there is a need for an improved process chamber that improves substrate temperature profile.

SUMMARY

Embodiments disclosed herein generally related to a processing chamber, and more specifically a heat modulator assembly for use in a processing chamber. The heat modulator assembly includes a heat modulator housing and a plurality of heat modulators. The heat modulator housing includes a housing member defining a housing plane, a sidewall, and an annular extension. The sidewall extends perpendicular to the housing plane. The annular extension extends outward from the sidewall. The plurality of heat modulators is positioned in the housing member.

In another embodiment, a process chamber is disclosed herein. The process chamber includes a chamber body, a substrate support, an upper inner reflector, and a heat modulator assembly. The chamber body defines an interior volume. The substrate support is disposed in the chamber body. The substrate support is configured to support a substrate for processing. The upper inner reflector is disposed in the chamber body, above the substrate support. The heat modulator assembly is disposed in the upper inner reflector. The heat modulator assembly includes a heat modulator housing and a plurality of heat modulators. The heat modulator housing includes a housing member defining a housing plane, a sidewall, and an annular extension. The sidewall extends perpendicular to the housing plane. The annular extension extends outward from the sidewall. The plurality of heat modulators is positioned in the housing member.

In another embodiment, a method of processing a substrate is disclosed herein. An epitaxial layer is formed on a surface of the substrate. A plurality of heating lamps heats the substrate. One or more heat modulators tune the rempearture of the substrate in a target area by heating the target area.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
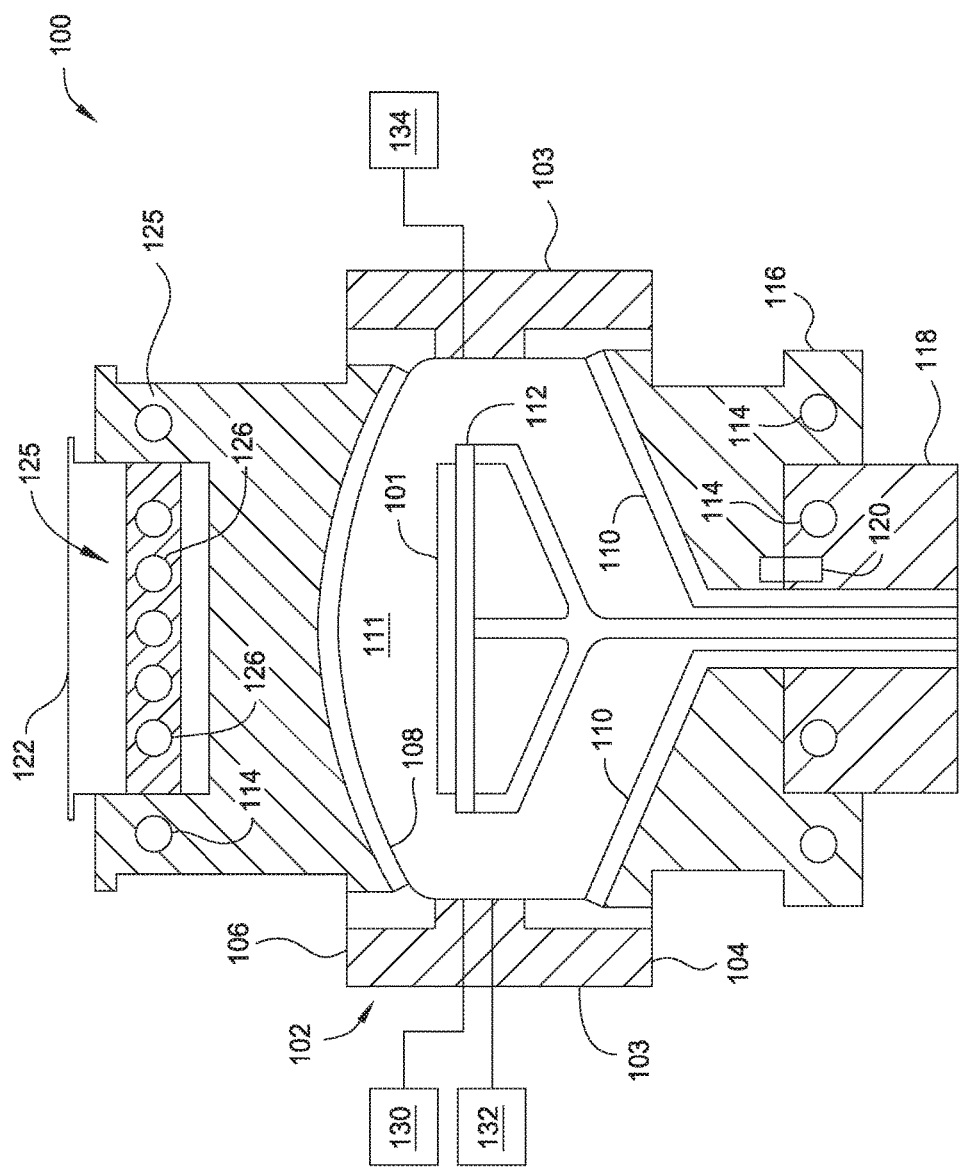
FIG. 1 illustrates a side sectional view of a process chamber 100, according to one embodiment.

FIG. 1 is a side sectional view of a process chamber 100, according to one embodiment. The process chamber 100 is configured to deposit epitaxial films on a substrate 101 disposed therein. The process chamber 100 includes a chamber body 102 having one or more sidewalls 103, a bottom 104, a top 106, an upper dome 108, and a lower dome 110. The chamber body 102 defines an interior volume 111.

The process chamber 100 may further include a substrate support 112, which may be a susceptor, disposed therein. The substrate support 112 is configured to support the substrate 101 during processing. The process chamber 100 further includes one or more lamps 114. The one or more lamps 114 may be disposed above and/or below the substrate support 112. In one embodiment, the lamps 114 may be tungsten filament lamps. The lamps 114 are configured to direct radiation, such as infrared radiation, through the lower dome 110 to heat the substrate 101 and/or the substrate support 112. The lower dome 110 may be made of a transparent material, such as quartz. The process chamber may further include a lower outer reflector 116 and a lower inner reflector 118. The lower outer reflector 116 is positioned beneath the lower dome 110, at least partially surrounding the lower inner reflector 118. The lower outer reflector 116 and the lower inner reflector 118 may be formed of aluminum and plated with a reflective material, such as gold. A temperature sensor 120, such as a pyrometer, can be installed in the lower inner reflector 118 to detect a temperature of the substrate support 112 or the back side of the substrate 101.

The lamps 114 positioned above the substrate support 112 are configured to direct radiation, such as infrared radiation, through the upper dome 108 towards the substrate support 112. The upper dome 108 may be formed from a transparent material, such as quartz. The process chamber 100 may further include an upper inner reflector 122 and an upper outer reflector 124. The upper outer reflector 124 may at least partially surround the upper inner reflector 122. The upper inner reflector 122 and the upper outer reflector 124 may be formed of aluminum and plated with a reflective material, such as gold. In one embodiment, the lamps 114 may be positioned in the upper outer reflector 124 but exterior to the upper inner reflector 122.

The process chamber 100 may further include a heat modulator assembly 125 having one or more heat modulators 126. The heat modulator assembly 125 may be positioned within the upper inner reflector 122. The heat modulators 126 are configured to increase the temperature of the substrate 101 at certain regions of the substrate 101 by fine tuning the substrate temperature. The heat modulators 126 are able to compensate for cold spots/rings on the substrate 101, thus resulting in more uniform epitaxial growth. For example the thickness profile of SiP and SEG Si processes suggest cold spots and/or rings are 40-80 mm in width and 1-8 C in magnitude. Three examples of heat modulators 126 (heat modulators 800, 900, and 1000) are discussed in more detail below, in conjunction with FIGS. 8-10. The three heat modulators are useful for processing different width of the substrate 101.

The process chamber 100 may be coupled to one or more process gas sources 130 that can supply the process gas used in the epitaxial depositions. The process chamber 100 can further be coupled to an exhaust device 132, such as a vacuum pump. In some embodiments, the process gases can be supplied on one side (e.g., the left side of FIG. 1) of the process chamber 100. Gases may be exhausted from the process chamber 100 on an opposing side (e.g., the right side of FIG. 1) to create a cross flow of process gases above the substrate 101. The process chamber 100 may also be coupled to a purge gas source 134.

Figure 2:
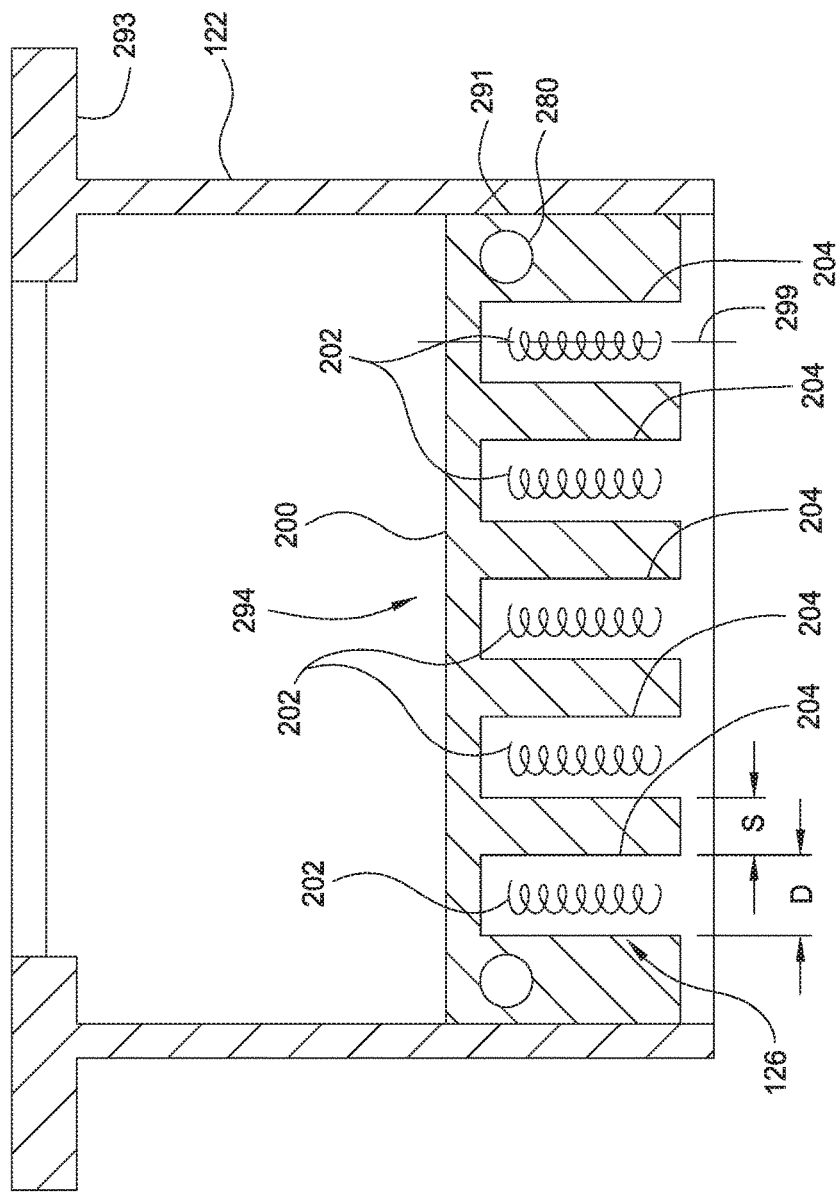
FIG. 2 illustrates a side sectional view of an upper light modulator assembly of the process chamber of FIG. 1, according to one embodiment.

FIG. 2 illustrates a cross-sectional view of the heat modulator assembly 125, according to one embodiment. The heat modulator assembly 125 includes a heat modulator housing 200 defining a housing plane 294, a sidewall 291, an annular extension 293, and one or more heat modulators 126. The sidewall 291 extends perpendicular to the housing plane 294. The annular extension extends outward from the sidewall 291. The heat modulator housing 200 may be positioned in the interior volume of the upper inner reflector 122. The heat modulator housing 200 is configured to be retrofitted in the upper inner reflector 122. The retrofit design is configured to extend the current hardware's capability. In the embodiment shown in FIG. 2, the one or more heat modulators 126 are vertical lamps 202, i.e. the one or more heat modulators 126 have a major axis 299 parallel to the sidewall 291 of the heat modulator housing 200. The vertical lamps 202 are disposed in the heat modulator housing 200. In one embodiment, the vertical lamps 202 may be positioned in a tube 204. The tube 204 may be formed from a reflective material, such as gold. In another embodiment, the tube 204 may include a coating of reflective material. In yet another embodiment, the lower surface of the housing 200 may include a reflective coating as well. The vertical lamps 202 may be positioned near the upper dome 108. In one embodiment, the vertical lamps 202 may be positioned as close to the upper dome 108 as possible.

Several factors may affect the tuning capabilities of the vertical lamps 202. In one embodiment, the spacing, S, between the vertical lamps 202 may impact the area of interest on the substrate 101 that will receive radiation from the lamps 202. For example, increasing the spacing, S, by about 20% changes. In another embodiment, a diameter, D, of the tube 204 affects the intensity of the radiation directed towards the substrate 101. For example, decreasing the diameter, D, by about 20% changes. In general, the spacing, S, between vertical lamps may be constant or non-constant. For example, the spacing between the vertical lamps 202 may be closer near a center of the upper inner reflector 122 compared to the spacing between vertical lamps 202 near a periphery of the upper inner reflector. Alternatively, the spacing between the vertical lamps 202 may be closer near the periphery of the upper inner reflector 122 compared to spacing of the vertical lamps 202 near the center of the upper inner reflector 122. In one embodiment, the spacing between vertical lamps 202 closer to the center of the upper inner reflector 122 is about 2 cm, and the spacing between the vertical lamps 202 near the periphery of the upper inner reflector 122 is about 4 cm. Additionally, the tubes 204 may include similar spacing as the vertical lamps 122. For example, the spacing between the tubes 204 may be closer near a center of the upper inner reflector 122 compared to the spacing between tubes 204 near a periphery of the upper inner reflector 122. Alternatively, the spacing between the tubes 204 may be closer near the periphery of the upper inner reflector 122 compared to spacing of the tubes 204 near the center of the upper inner reflector 122.

As shown in FIG. 2, heating lamps 114 may be positioned about the upper inner reflector 122. In one embodiment, the vertical lamps 202 may be positioned on a same level as the heating lamps 114. Positioning of the vertical lamps 202 with respect to the heating lamps 114 may also have an effect on the irradiance profile of the substrate 101.

Each vertical lamp 202 generally extends along a longitudinal axis of the tube 204 from a first end of the vertical lamp 202 to a second end thereof. The first end may be 1-10 mm from a corresponding end of the tube 204, and the second end may be 1-20 mm from the tube opening. Recess depth of the vertical lamps 202 within the tubes 204 may be constant, or may vary according to any pattern or relationship. For example, in one embodiment a first plurality of vertical lamps 202 are recessed a first depth within their respective tubes 204 and a second plurality of vertical lamps 202 are recessed a second depth, different from the first depth, within their respective tubes 204. In one embodiment, the housing 200 may include a conduit 280 formed therein. The conduit 280 may be configured to flow a cooling fluid through the sidewalls of the housing 200. In another embodiment, the conduit 280 of the housing may be in fluid communication with a second fluid conduit (not shown) in the housing 200. Let's also throw an optional conduit into the housing 200 to flow cooling fluid. They might eventually want that. Fluid goes in and out at the top. Could also flow through the walls of the inner reflector down to the housing 200.

Figure 3:
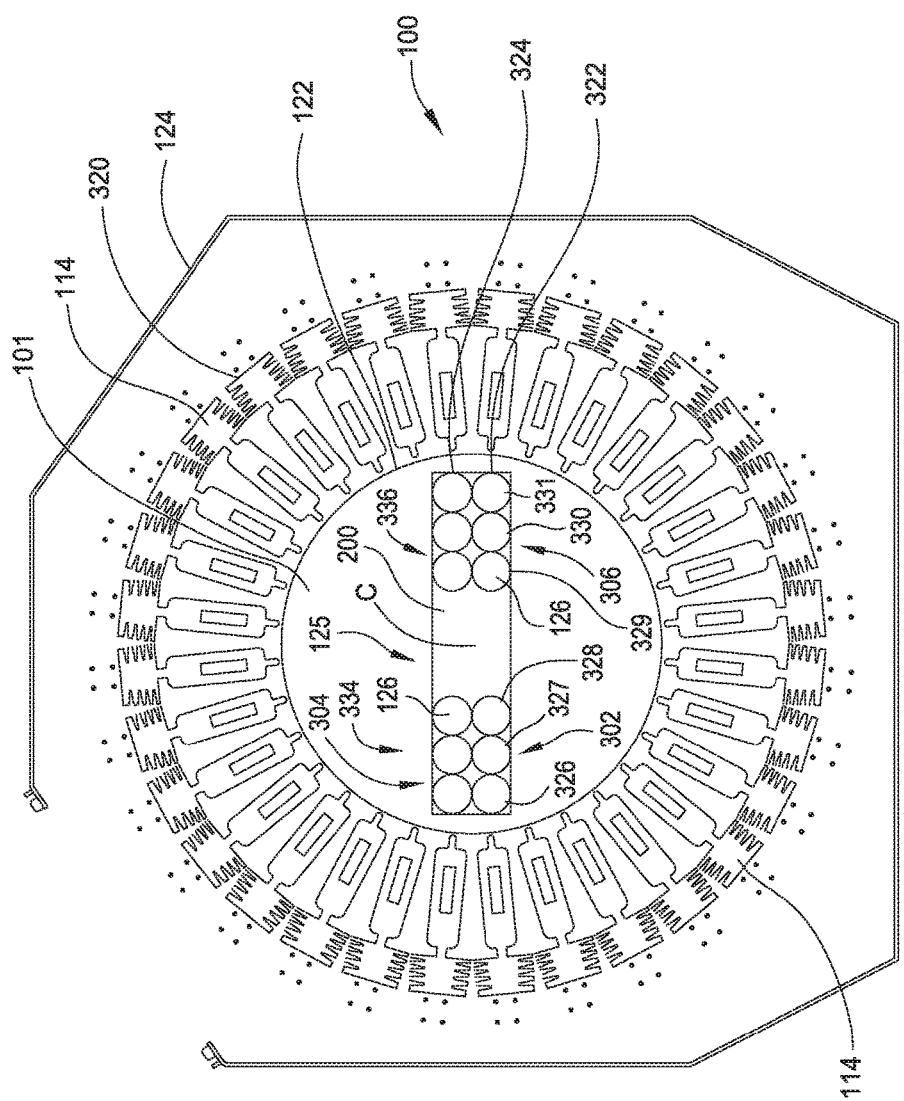
FIG. 3 illustrates a top view of the process chamber of FIG. 1 having a heat modulator assembly, according to one embodiment.

FIG. 3 illustrates a top view of the process chamber 100 having the heat modulator assembly 125 according to one embodiment. The lamps 114 are shown horizontally surrounding the upper inner reflector 122. In one embodiment, the lamps 114 are oriented with a major axis along a chamber radius. The lamps 114 extend between the upper outer reflector 124 and the upper inner reflector 122. In the embodiment of FIG. 3, the upper inner reflector 122 has a circular shape and the upper outer reflector 124 has a sectionally linear shape with corners, thus forming an enclosure around the lamps 114 The heat modulator housing 200 is shown with a single-axis formation 302. The heat modulator housing 200 houses the heat modulators 126 in the interior of the upper inner reflector 122 along a single-axis in a vertical manner. In one embodiment, the heat modulators 126 are arranged in two rows 322, 324 and six columns 326, 327, 328, 329, 330, 331, extending in a direction perpendicular to the plane in FIG. 3. Three (326-328) of the six columns 326-331 are positioned on a first side 334 of the heat modulator housing 200. Three (329-331) of the six columns 326-331 are positioned on a second side 336 of the heat modulator housing 200. The first column 326 of heat modulators 126 on the first side 334 and the first column 331 of heat modulators 126 on the second side 336 are positioned about 75 mm away from a center, C, of the heat modulator housing 200. The last column 328 of heat modulators 126 on the first side 334 and the last column 329 of heat modulators 126 on the second side 336 are positioned about 25 mm from the center, C, of the heat modulator housing 200. The heat modulators 126 may be spaced such that the heat modulators 126 may direct radiation to specific areas of interest on the substrate 101. For example, as shown in FIG. 2, the heat modulators 126 are arranged in two clusters 304, 306. Each cluster 304, 306 includes three pairs of heat modulators 126. In one embodiment, the pairs of heat modulators 126 are spaced about 30 mm apart. The heat modulator housing 200 having the single-axis formation 302 is capable of other light modulator arrangements.

Figure 4:
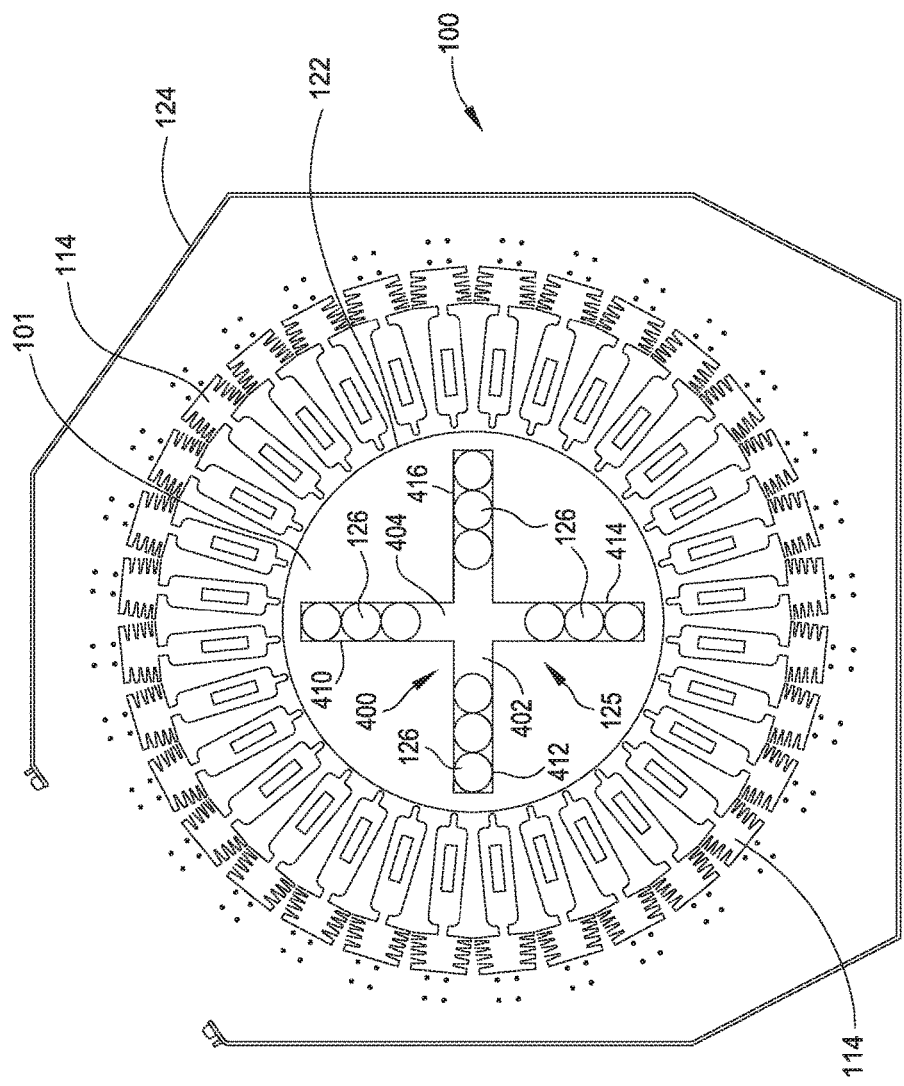
FIG. 4 illustrates a top view of the process chamber of FIG. 1 having a heat modulator assembly, according to one embodiment.

FIG. 4 illustrates a top view of the process chamber 100, according to another embodiment. The heat modulator housing 200 has a two-axis formation 400. The two-axis formation 400 is configured such that heat modulators 126 may be positioned along a first axis 402 and a second axis 404 of the heat modulator housing 200. The different heat modulator housing 200 shape impacts the irradiance profile generated by the heat modulators 126. The two-axis formation has four arm structures 412-416, each arm structure 412-416 having the same number of heat modulators—in the embodiment of FIG. 4, three heat modulators—although the number of heat modulators in each arm structure could be different. In one embodiment, the distance from a center of formation 400 to a first heat modulator 126 in each arm structure may be 75 mm. In one embodiment, the distance from the last heat modulator 126 in each arm structure 410-416 (closest to the end of the corresponding arm structure) to the end of the corresponding arm structure is 0.1 mm to 20 mm.

Figure 5:
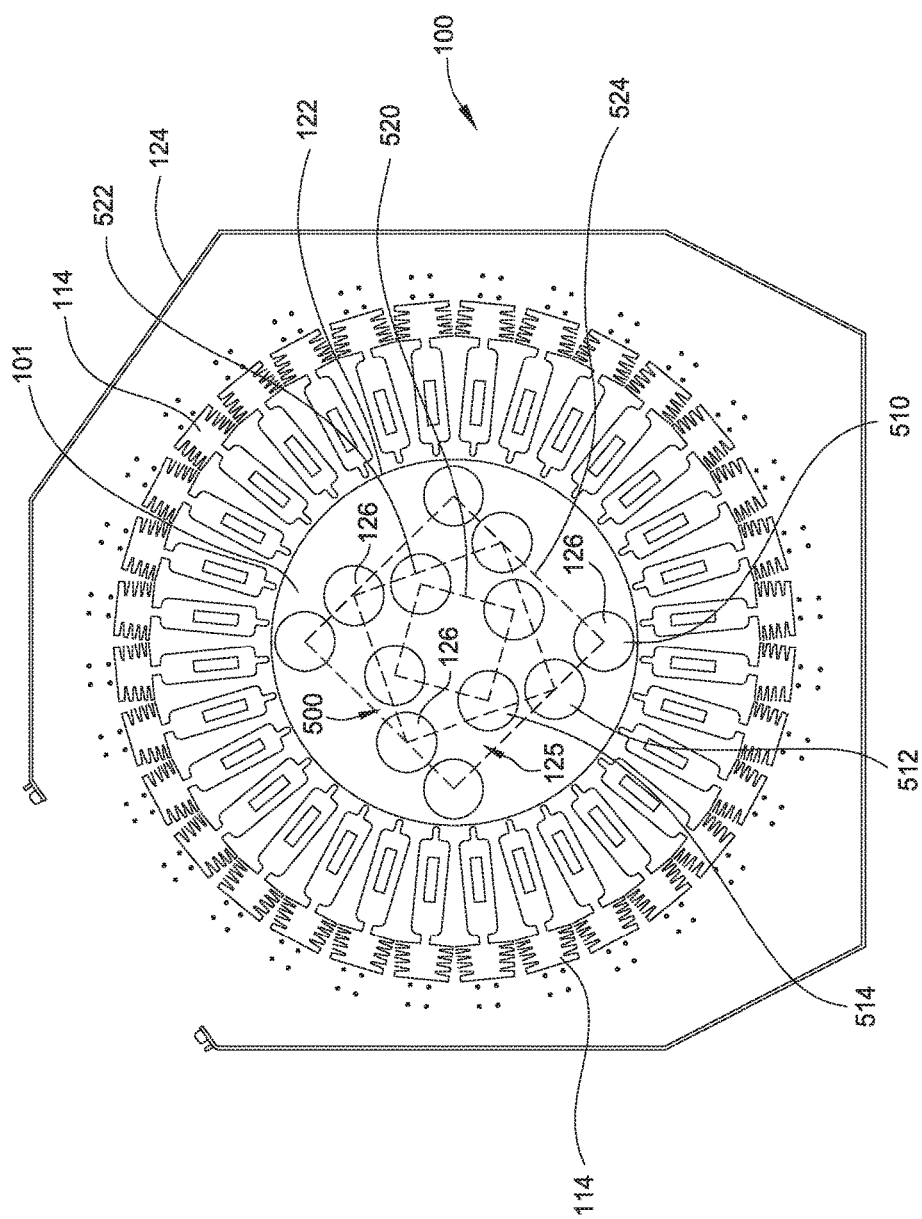
FIG. 5 illustrates a top view of the process chamber of FIG. 1 having a heat modulator assembly, according to one embodiment.

FIG. 5 illustrates a top view of the process chamber 100, according to another embodiment. The heat modulator housing 200 has a multi-axis formation 500. The multi-axis formation 500 is configured such that the heat modulators may be positioned along two or more axes in the interior of the upper inner reflector 122. In the multi-axis formation 500, the heat modulators 126 may be spaced about 50 mm apart such that heat modulators 126 positioned in two different axes do not align. As illustrated in the example of FIG. 5, the multi-axis formation 500 includes twelve heat modulators 126 arranged in four groups of three. Each group of three is aligned along a spiral curve from a location near a center of the formation 500 to a location near a periphery of the formation 500. The location near the center is about 40% of the distance from the center to the edge of the upper inner reflector 122. Each group has innermost 510, middle 512, and outermost 514 heat modulators. The innermost heat modulators 510 are arranged in a first square 520 (shown in phantom), the middle heat modulators 512 are arranged in a second square 522 (shown in phantom), and the outermost heat modulators 514 are arranged in a third square 524 (shown in phantom). The first square 520 has a first length and a first width. The second square 522 has a second length and a second width. The third square 524 has a third length and third length. The first length is less than the second length. The first width is less than the second width. The second length is less than the third length. The second width is less than the third width. In one embodiment the first square 520, second square 522, and third square 524 share the same center. The second square 522 is rotated relative to the first 520 and third squares 524. The third square 524 is rotated relative to the first 520 and second 522 squares. In the embodiment of FIG. 5, the angle of the second square 522 relative to the first square 520 is about 40°, and the angle of the third square 524 relative to the second square 522 is about 30°. The relative positions of the heat modulators 126 in the formation 500 may be adjusted to achieve any desired spacing or orientation regarding the spiral curves and squares, including making the squares rectangles in some cases.

Figure 6:
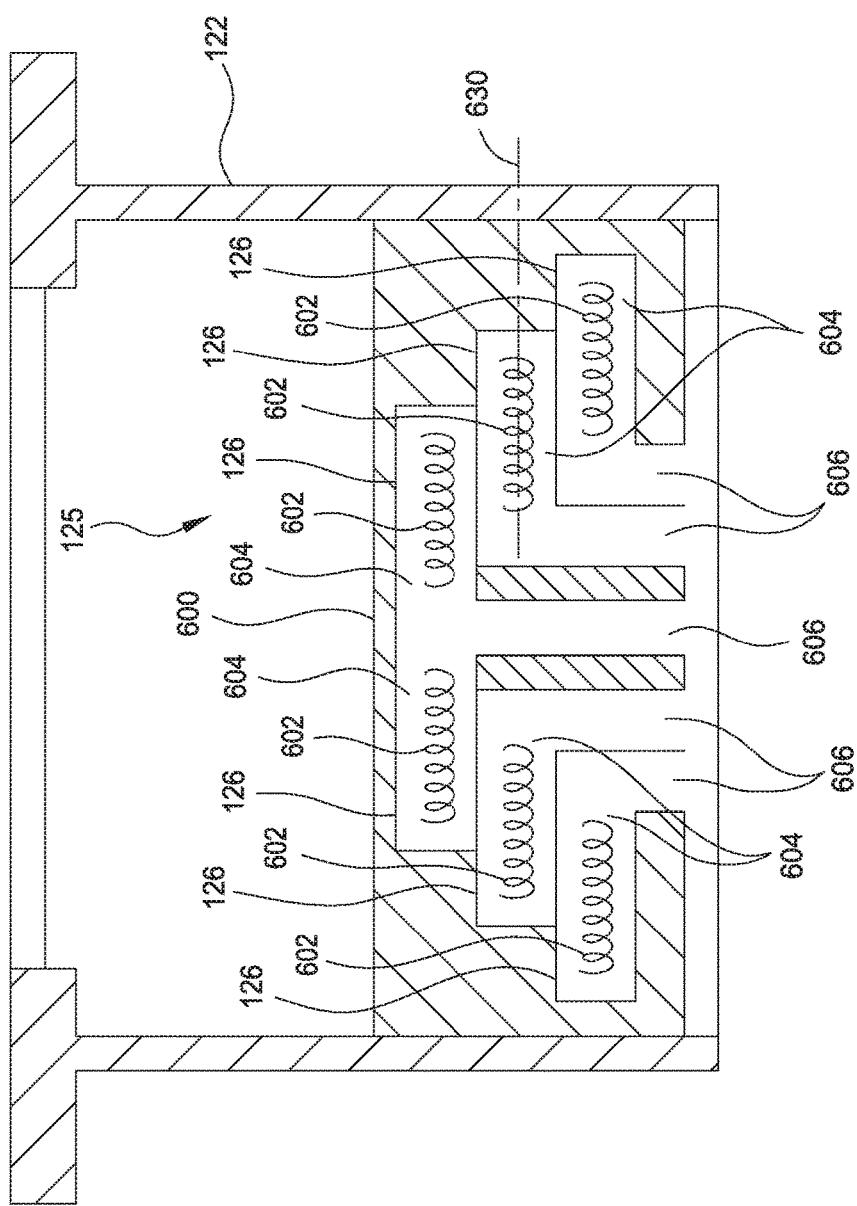
FIG. 6 illustrates a cross-sectional view of the heat modulator assembly, according to one embodiment.

FIG. 6 illustrates a cross-sectional view of the heat modulator assembly 125, according to another embodiment. The heat modulator assembly 125 includes a heat modulator housing 600 and one or more heat modulators 126. The heat modulator housing 600 is substantially similar to heat modulator housing 200. In the embodiment shown in FIG. 6, the one or more heat modulators 126 are horizontal lamps 602, i.e. the one or more heat modulators 126 have a major axis 630 that is perpendicular to the sidewall of the heat modulator housing 600. The horizontal lamps 602 are disposed in the heat modulator housing 600. In one embodiment, the horizontal lamps 602 are disposed in a tube 604. One or more horizontal lamps 602 may be disposed in each tube 604. The tube 604 may be formed from a reflective material, such as gold. The horizontal lamps 602 may be positioned such that the tube 604 is in communication with an opening 606 formed in the heat modulator housing 600. The tubes 604 may be stacked in the heat modulator housing 600 in a stepped manner. In one embodiment, the tubes 604 may be stacked about a central opening 606. For example, there may be three tubes 604 stacked on a first side of the central opening 606 and a three tubes 604 stacked on a second side of the central opening 606. The stepped formation allows each opening to be in fluid communication between a given tube 604 and an exit surface of the heat modulator housing 600. In one embodiment, each tube 604 is in communication with a single opening 606. In another embodiment, one or more tubes 604 are in communication with a single opening 606. The horizontal lamps 602 are configured to direct radiation down the openings 606 towards a surface of the substrate 101.

Figure 7A:
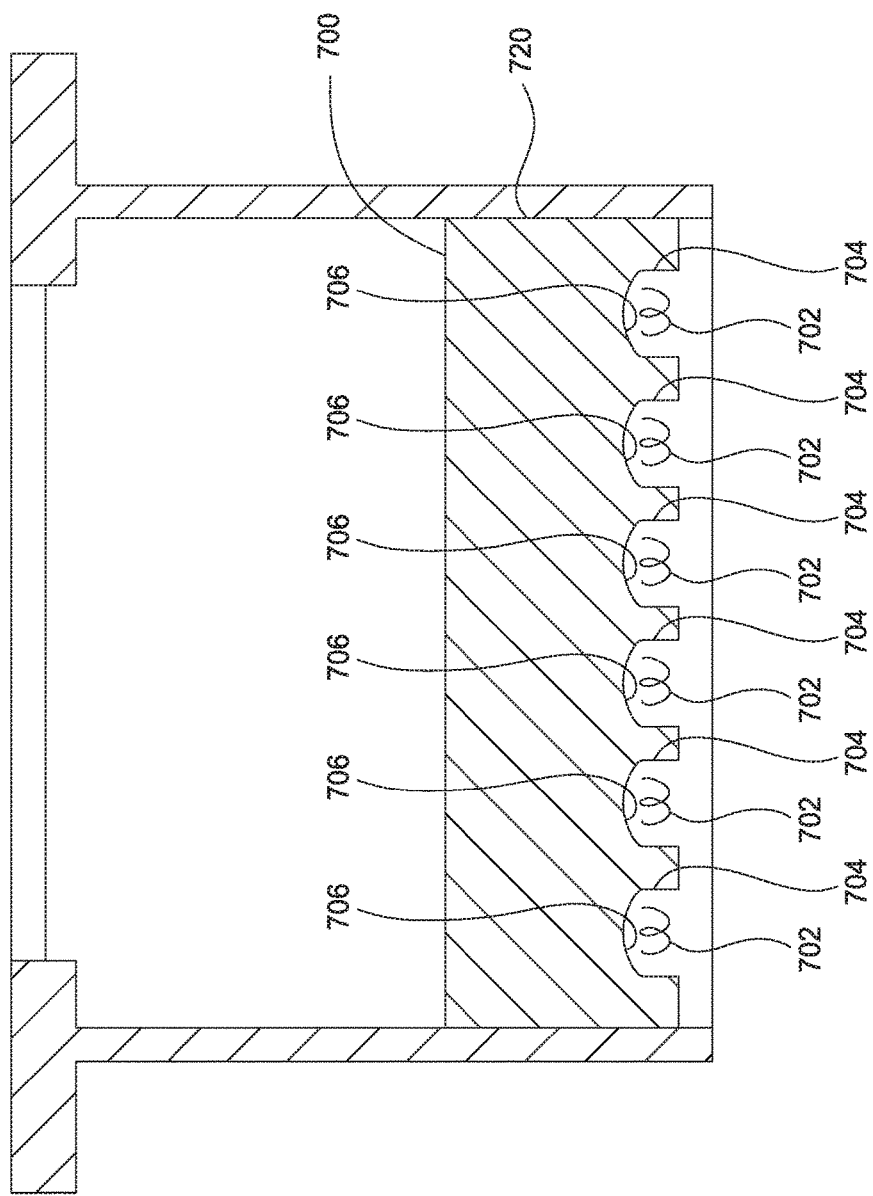
FIG. 7A illustrates a cross-sectional view of the heat modulator assembly, according to one embodiment.
Figure 7B:
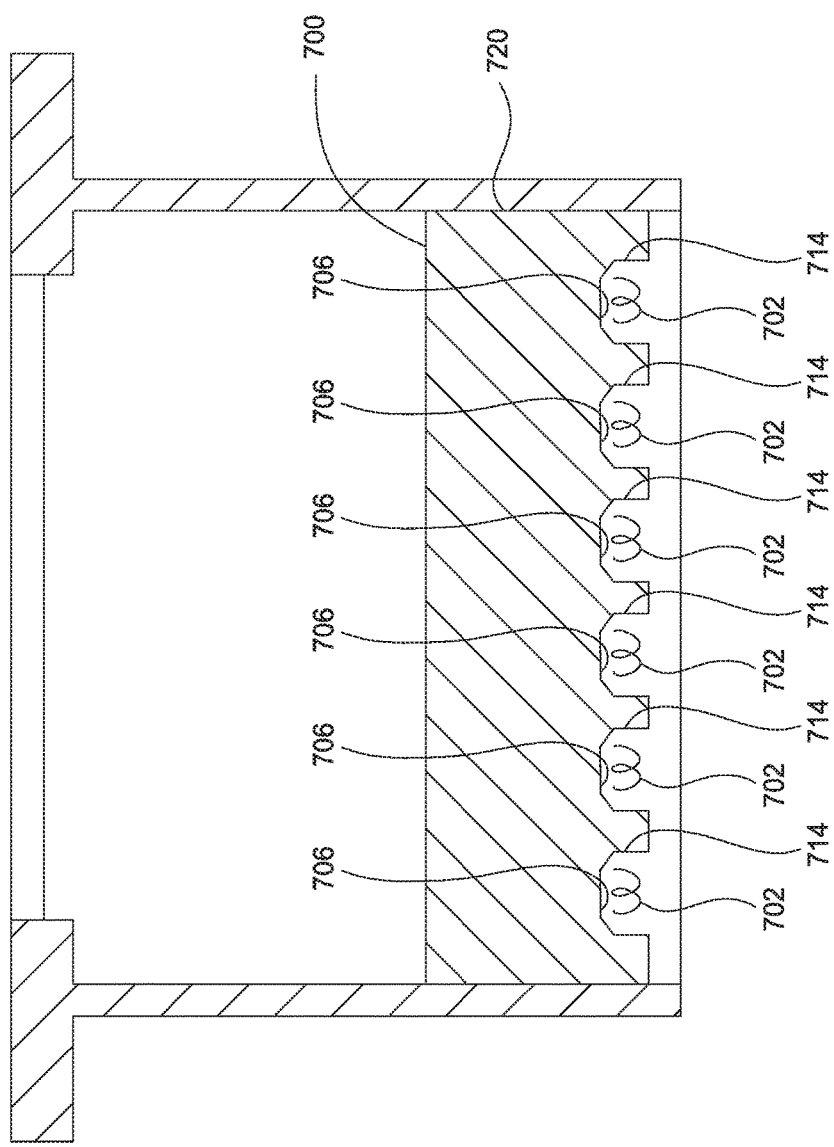
FIG. 7B illustrates a cross-sectional view of the heat modulator assembly, according to one embodiment.

FIG. 7A illustrates a cross-sectional view of the heat modulator assembly 125, according to another embodiment. The heat modulator assembly 125 includes a heat modulator housing 700 and one or more heat modulators 126. The heat modulator housing 700 is substantially similar to heat modulator housings 200 and 600. The heat modulator housing 700 includes one or more ring shaped openings 704. The one or more ring shaped openings 704 house the one or more heat modulators 126. In the embodiment shown in FIG. 7A, the one or more heat modulators 126 are in the form of linear lamps 702. The linear lamps 702 may be arranged piecewise about the circumference of each ring shaped opening 704. As illustrated in FIG. 7A, the arrangement of linear lamps is axisymmetric. The one or more ring shaped openings 704 include a reflective surface 706, which may be formed of gold. The ring shaped openings 704 have cross-sectional shape that creates a focus of radiation emitted near the ring shaped openings 704. The shape may be circular, ellipsoidal, parabolic, hyperbolic, polyganized, or any mixture or intermediate thereof. For example, FIG. 7B illustrates a cross-sectional view of the heat modulator assembly 125 having openings 714 which are polyganized. The ring shaped openings 704 may be the same shape, with the same focal characteristics, or may have different shapes with different focal characteristics. For example, the focus of a ring shaped opening 704 may define a line, together with the filament 702 disposed in the ring shaped opening 704, that is parallel to a side 720 of the upper inner reflector 122, or that is not parallel to the side 720 of the upper inner reflector 122 according to any extent. The cross-sectional shape of a ring shaped opening 704 may be constant for the entire length thereof, or may vary according to any pattern. The linear lamps 702 may be positioned at different foci in the heat modulator housing 700. In one embodiment, the filament (not shown) of the linear lamp 702 will be small and the focus is close to the reflective surface 706. This results in more uniform coverage by locating the filament near the focus of a parabolic trench. For example, the filament will be about 2.5 mm in diameter, and the focus is 5 mm away from the reflective surface 706. In one embodiment, the linear lamps 702 are positioned at the object plane and the substrate 101 is positioned at the image plane.

Figure 7C:
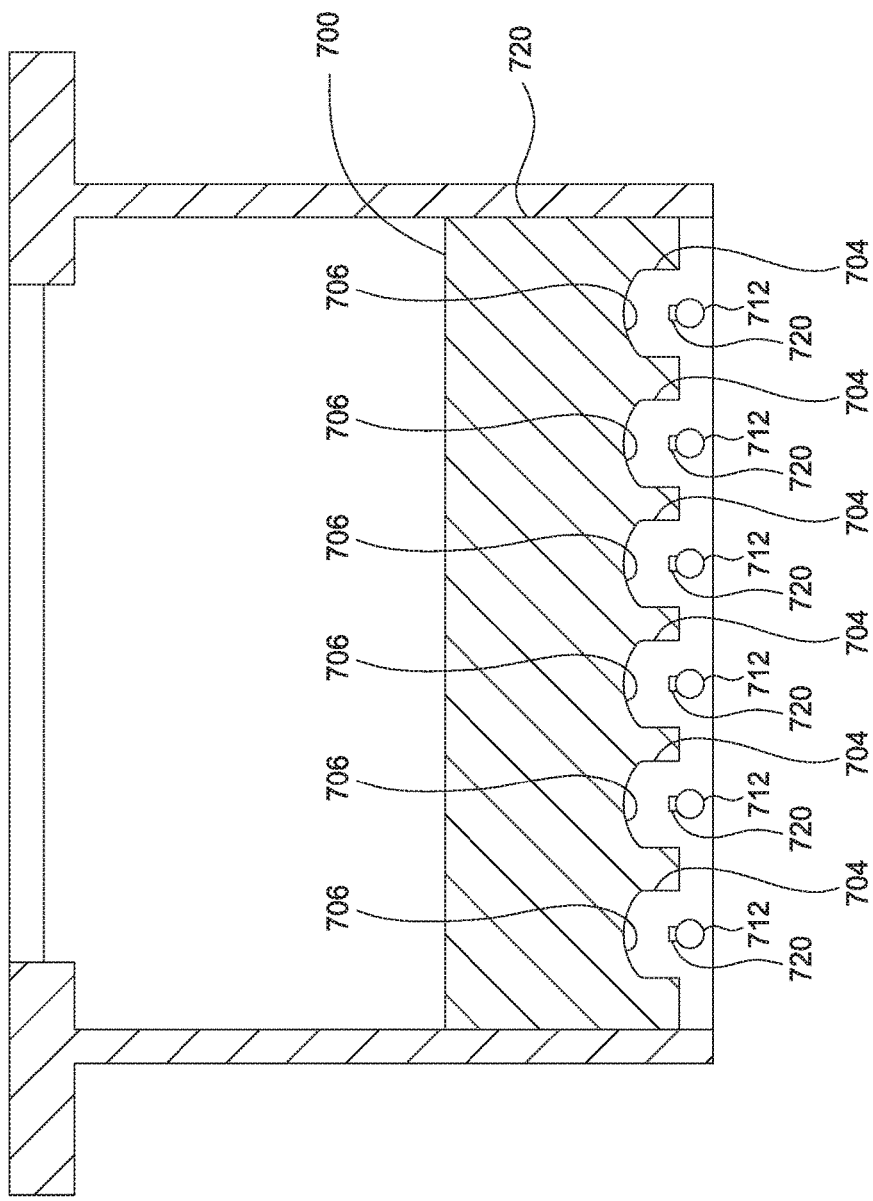
FIG. 7C illustrates a cross-sectional view of the heat modulator assembly, according to one embodiment.

In one embodiment, such as that shown in FIG. 7C, the heat modulator assembly 125 includes one or more light emitting diode (LED) heat sources 720 positioned in the opening 704. For example, one or more LED heat sources 720 may be positioned about a cooling tube 212.

Figure 8:
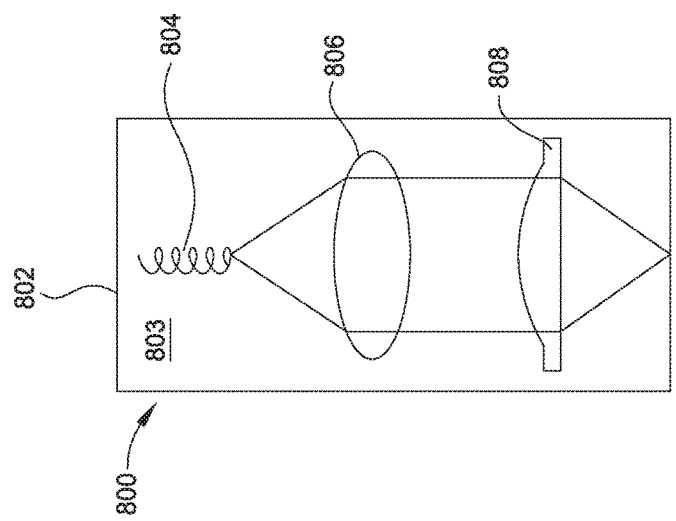
FIG. 8 illustrates a heat modulator of the heat modulator assembly, according to one embodiment.

FIG. 8 illustrates a heat modulator 800, according to one embodiment. The heat modulator 800 may be used in place of heat modulator 126 in any of the above referenced embodiments. The heat modulator 800 includes a body 802. The body 802 defines an interior volume 803. The heat modulator 800 further includes a lamp 804, a first convex lens 806, and a second convex lens 808 disposed in the interior volume 803. The first convex lens 806 is configured to collect and collimate rays from the lamp 804. The second convex lens 808 is configured to converge the collimated rays on the substrate 101. The heat modulator 800 is positioned such that the substrate 101 is positioned at the focus of the second convex lens 808. Because the heat modulator 800 is positioned in a tube reflector, the tube reflector helps dissipate the energy of the rays outside of the collection angle of the first convex lens 806. The heat modulator 800 is able to deliver low energy to a medium sized area on the substrate 101.

Figure 9:
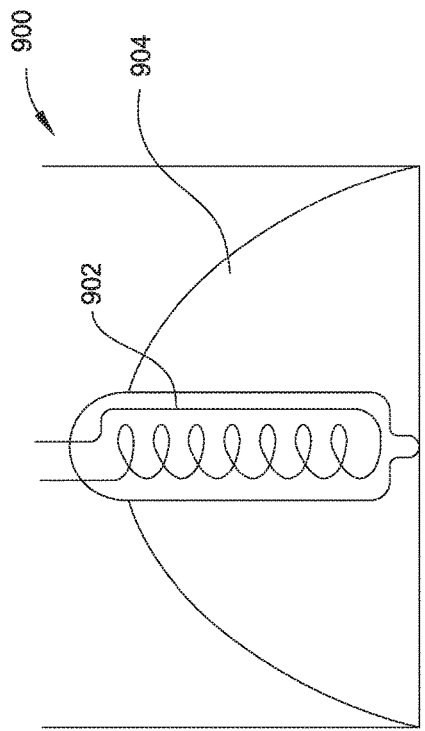
FIG. 9 illustrates a heat modulator of the heat modulator assembly, according to one embodiment.

FIG. 9 illustrates a heat modulator 900, according to one embodiment. The heat modulator 900 includes an lamp 902 and an ellipsoid reflector 904. In one embodiment, the lamp 902 is a rapid thermal processing (RTP) lamp. The lamp 902 and the substrate 101 are positioned such that they lie at the foci of the ellipsoid reflector 904. The rays emitted from the lamp 902 and collected by the ellipsoid reflector converge at the second focus, i.e., on the substrate 101. The substrate will receive a portion of direct and scattered irradiation from the lamp 902, without any focusing. The heat modulator 900 is configured to deliver a high energy to a large are of the substrate 101.

Figure 10:
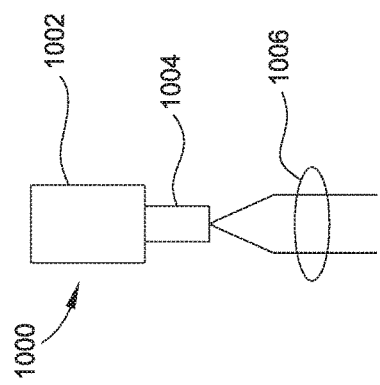
FIG. 10 illustrates a heat modulator of the heat modulator assembly, according to one embodiment.

FIG. 10 illustrates a heat modulator 1000, according to one embodiment. The heat modulator 1000 includes a diode laser 1002, an optical fiber 1004, and a convex lens 1006. The diode laser 1002 is delivered through the optical fiber 1004. The convex lens 1006 is mounted in front of the fiber 1004. The convex lens is configured to control the laser spot size on the substrate 101. The heat modulator 1000 is configured to deliver a high energy to a small area of the substrate 101.

Any of the heat modulators (800, 900, 1000) discussed above in FIGS. 8-10 may be used in the heat modulator assembly discussed in FIGS. 1-7. Additionally, any combination of the heat modulators (800-1000) may be used at well.

In operation, the process chamber forms an epitaxial layer on the surface of the substrate. The one or more heating lamps 114 are configured to heat at least a top surface of the substrate. In one embodiment, the one or more heating lamps 114 are also configured to heat a bottom surface of the substrate. The heat modulator assembly 125 selectively heats areas of interests on the substrate. For example, the heat modulators are configured to fine tune the substrate temperature such that typical cold spots, which occur during conventional processing, are avoided.

While the foregoing is directed to specific embodiments, other and further embodiments may be devised without departing from the basic scope thereof, and the scope thereof is determined by the claims that follow.

What is claimed is:

1. An assembly, comprising:
an upper outer reflector comprising a plurality of lamps positioned therein, the plurality of lamps surrounding an upper inner reflector, each lamp of the plurality of lamps having a first major axis, the upper inner reflector and the upper outer reflector forming an enclosure around the plurality of lamps, the upper inner reflector comprising a heat modulator assembly positioned therein, the heat modulator assembly comprising:
a heat modulator housing configured to be retrofitted in the upper inner reflector, the heat modulator housing comprising a housing member defining a housing plane, a sidewall extending perpendicular to the housing plane, and an annular extension extending outward from the sidewall, wherein the heat modulator housing is in a multi-axis arrangement; and
a plurality of heat modulators positioned in the housing member on a same horizontal level as the plurality of lamps, each heat modulator having a second major axis substantially perpendicular to each first major axis.

2. The assembly of claim 1, wherein the multi-axis arrangement is a two-axis formation with the heat modulators positioned along a first axis and a second axis.

3. The assembly of claim 1, wherein the multi-axis arrangement is a multi-axis formation with the heat modulators positioned along two or more axes.

4. The assembly of claim 3, wherein the two or more axes do not align.

5. The assembly of claim 1, wherein each of the heat modulators comprises:
a body;

a filament disposed in the body;
a first convex lens disposed in the body to collect and collimate rays from the filament; and
a second convex lens disposed in the body to converge the collimated rays.

6. The assembly of claim 1, wherein each of the heat modulators comprises:
a lamp; and
an ellipsoid reflector positioned about the lamp such that the lamp is positioned at a focus of the ellipsoid reflector.

7. The assembly of claim 1, wherein at least one of the heat modulators comprises:
a diode laser;
an optical fiber positioned adjacent the diode laser; and
a convex lens mounted between the fiber to control a laser spot size.

8. The assembly of claim 2, wherein the two-axis formation comprises a plurality of arm structures with each arm structure having the same number of heat modulators.

9. The assembly of claim 4, wherein the multi-axis formation comprises a plurality of groups having the same number of heat modulators.

10. The assembly of claim 9, wherein each of the plurality of groups is aligned along a spiral curve from a location near a center of the multi-axis formation to a periphery of the multi-axis formation.

11. A process chamber, comprising:
a chamber body defining an interior volume;
a substrate support disposed in the chamber body, the substrate support configured to support a substrate for processing;
an upper inner reflector disposed in the chamber body, above the substrate support; and
a heat modulator assembly disposed in the upper inner reflector, the heat modulator assembly comprising:
a heat modulator housing comprising a housing member defining a housing plane, a sidewall extending perpendicular to the housing plane, and an annular extension extending outward from the sidewall, wherein the heat modulator housing is in a multi-axis arrangement; and
a plurality of heat modulators positioned in the housing member.

12. The process chamber of claim 11, wherein the multi-axis arrangement is a two-axis formation with the heat modulators positioned along a first axis and a second axis.

13. The process chamber of claim 11, wherein the multi-axis arrangement is a multi-axis formation with the heat modulators positioned along two or more axes that do not align.

14. The process chamber of claim 13, wherein the multi-axis formation comprises a plurality of groups, each group of the plurality of groups aligned along a spiral curve from a location near a center of the multi-axis formation to a periphery of the multi-axis formation.

15. The process chamber of claim 11, wherein at least one of the heat modulators comprises:
a body;
a filament disposed in the body;
a first convex lens disposed in the body to collect and collimate rays from the filament; and
a second convex lens disposed in the body to converge the collimated rays.

16. The process chamber of claim 11, wherein at least one of the heat modulators comprises:
a lamp; and
an ellipsoid reflector positioned about the lamp such that the lamp is positioned at a focus of the ellipsoid reflector.

17. The process chamber of claim 11, wherein at least one of the heat modulators comprises:
a diode laser;
an optical fiber positioned adjacent the diode laser; and
a convex lens mounted between the fiber to control a laser spot size.

18. A method of processing a substrate, comprising:
forming an epitaxial layer on a surface of the substrate;
heating the substrate with a plurality of heating lamps surrounding a heat modulator housing, each lamp of the plurality of heating lamps having a first major axis; and
tuning a temperature of the substrate in a target area by heating the target area with a plurality of heat modulators, each heat modulator having a second major axis substantially perpendicular to each first major axis and each heat modulator is positioned in an interior volume of an upper inner reflector on a same horizontal level as the plurality of heating lamps.

19. The method of claim 18, wherein heating the target area of the substrate comprises:
supplying heat to the surface of the substrate with the heat modulators, wherein each heat modulator comprises:
a body;
a filament disposed in the body;
a first convex lens disposed in the body to collect and collimate rays from the filament; and
a second convex lens disposed in the body to converge the collimated rays onto the substrate.

20. The method of claim 18, wherein heating the target area of the substrate comprises:
supplying heat to the surface of the substrate with the plurality of heat modulators, wherein each heat modulator comprises:
a lamp; and
an ellipsoid reflector positioned about the lamp such that the lamp is positioned at a focus of the ellipsoid reflector.

21. The heat modulator assembly of claim 11, wherein the upper inner reflector is partially surrounded by an upper outer reflector, the upper outer reflector having a plurality of lamps positioned therein, the plurality of lamps surrounding the upper inner reflector, each lamp of the plurality of lamps having a first major axis, the upper inner reflector and the upper outer reflector forming an enclosure around the plurality of lamps.

22. The heat modulator assembly of claim 21, wherein the plurality of heat modulators is positioned on a same horizontal level as the plurality of lamps, each heat modulator having a second major axis substantially perpendicular to each first major axis.

* * * * *